(12) United States Patent
Chua et al.

(10) Patent No.: US 7,601,648 B2
(45) Date of Patent: Oct. 13, 2009

(54) METHOD FOR FABRICATING AN INTEGRATED GATE DIELECTRIC LAYER FOR FIELD EFFECT TRANSISTORS

(75) Inventors: Thai Cheng Chua, Cupertino, CA (US); Shankar Muthukrisnan, Plano, TX (US); Johanes Swenberg, Los Gatos, CA (US); Shreyas Kher, Campbell, CA (US); Chikuang Charles Wang, San Jose, CA (US); Giuseppina Conti, Oakland, CA (US); Yuri Uritsky, Newark, CA (US)

(73) Assignee: Applied Materials, Inc., Santa Clara, CA (US)

( * ) Notice: Subject to any disclaimer, the term of this patent is extended or adjusted under 35 U.S.C. 154(b) by 234 days.

(21) Appl. No.: 11/496,411

(22) Filed: Jul. 31, 2006

(65) Prior Publication Data

US 2008/0026553 A1    Jan. 31, 2008

(51) Int. Cl.
*H01L 21/31*    (2006.01)
(52) U.S. Cl. ............... 438/763; 438/287; 257/E21.409
(58) Field of Classification Search .............. 438/761, 438/763, 287
See application file for complete search history.

(56) References Cited

U.S. PATENT DOCUMENTS

| 4,058,430 | A | 11/1977 | Suntola et al. |
|---|---|---|---|
| 4,415,275 | A | 11/1983 | Dietrich |
| 4,761,269 | A | 8/1988 | Conger et al. |
| 4,834,831 | A | 5/1989 | Nishizawa et al. |
| 4,975,252 | A | 12/1990 | Nishizawa et al. |
| 4,993,357 | A | 2/1991 | Scholz |
| 5,027,746 | A | 7/1991 | Frijlink et al. |
| 5,173,327 | A | 12/1992 | Sandhu et al. |
| 5,178,681 | A | 1/1993 | Moore et al. |
| 5,225,366 | A | 7/1993 | Yoder |
| 5,261,959 | A | 11/1993 | Gasworth |
| 5,281,274 | A | 1/1994 | Yoder |
| 5,294,286 | A | 3/1994 | Nishizawa et al. |
| 5,338,362 | A | 8/1994 | Imahashi |
| 5,441,703 | A | 8/1995 | Jurgensen |
| 5,443,647 | A | 8/1995 | Aucoin et al. |
| 5,674,786 | A | 10/1997 | Turner et al. |
| 5,730,802 | A | 3/1998 | Ishizumi et al. |

(Continued)

OTHER PUBLICATIONS

International Search Report and Written Opinion for PCT/US07/73525, dated from Dec. 27, 2007.

(Continued)

*Primary Examiner*—Alexander G Ghyka
*Assistant Examiner*—Reema Patel
(74) *Attorney, Agent, or Firm*—Patterson & Sheridan, LLP (57) ABSTRACT

Methods for forming a integrated gate dielectric layer on a substrate are provided. In one embodiment, the method includes forming a silicon oxide layer on a substrate, plasma treating the silicon oxide layer, depositing a silicon nitride layer on the silicon oxide layer by an ALD process, and thermal annealing the substrate. In another embodiment, the method includes precleaning a substrate, forming a silicon oxide layer on the substrate, plasma treating the silicon oxide layer, depositing a silicon nitride layer on the silicon oxide layer by an ALD process, and thermal annealing the substrate, wherein the formed silicon oxide layer and the silicon nitride layer has a total thickness less than 30 Å utilized as a gate dielectric layer in a gate structure.

18 Claims, 4 Drawing Sheets

U.S. PATENT DOCUMENTS

| | | | |
|---|---|---|---|
| 5,796,116 | A | 8/1998 | Nakata et al. |
| 5,835,677 | A | 11/1998 | Li et al. |
| 5,879,459 | A | 3/1999 | Gadgli et al. |
| 5,972,430 | A | 10/1999 | DiMeo, Jr. et al. |
| 6,042,652 | A | 3/2000 | Hyun et al. |
| 6,071,572 | A | 6/2000 | Mosely et al. |
| 6,174,377 | B1 | 1/2001 | Doering et al. |
| 6,183,563 | B1 | 2/2001 | Choi et al. |
| 6,231,672 | B1 | 5/2001 | Choi et al. |
| 6,302,965 | B1 | 10/2001 | Umotoy et al. |
| 6,306,216 | B1 | 10/2001 | Kim et al. |
| 6,447,607 | B2 | 9/2002 | Soininen et al. |
| 6,481,945 | B1 | 11/2002 | Hasper et al. |
| 6,551,406 | B2 | 4/2003 | Kilpi |
| 6,572,705 | B1 | 6/2003 | Suntola et al. |
| 6,578,287 | B2 | 6/2003 | Aswad |
| 6,579,372 | B2 | 6/2003 | Park |
| 6,593,484 | B2 | 7/2003 | Yasuhara et al. |
| 6,630,030 | B1 | 10/2003 | Suntola et al. |
| 6,630,201 | B2 | 10/2003 | Chiang et al. |
| 6,632,747 | B2 | 10/2003 | Niimi et al. |
| 6,660,126 | B2 | 12/2003 | Nguyen et al. |
| 6,716,287 | B1 | 4/2004 | Santiago et al. |
| 6,718,126 | B2 | 4/2004 | Lei |
| 6,734,020 | B2 | 5/2004 | Lu et al. |
| 6,772,072 | B2 | 8/2004 | Ganguli et al. |
| 6,773,507 | B2 | 8/2004 | Jallepally et al. |
| 6,777,352 | B2 | 8/2004 | Tepman et al. |
| 6,778,762 | B1 | 8/2004 | Shareef et al. |
| 6,818,094 | B2 | 11/2004 | Yudovsky |
| 6,821,563 | B2 | 11/2004 | Yudovsky |
| 6,866,746 | B2 | 3/2005 | Lei et al. |
| 6,868,859 | B2 | 3/2005 | Yudovsky |
| 6,881,437 | B2 | 4/2005 | Ivanov et al. |
| 6,902,624 | B2 | 6/2005 | Seidel et al. |
| 6,921,062 | B2 | 7/2005 | Gregg et al. |
| 2001/0011526 | A1 | 8/2001 | Doering et al. |
| 2001/0013312 | A1 | 8/2001 | Soininen et al. |
| 2001/0014371 | A1 | 8/2001 | Kilpi |
| 2001/0042523 | A1 | 11/2001 | Kesala |
| 2001/0042799 | A1 | 11/2001 | Kim et al. |
| 2001/0054377 | A1 | 12/2001 | Lindfors et al. |
| 2002/0000196 | A1 | 1/2002 | Park |
| 2002/0000598 | A1 | 1/2002 | Kang et al. |
| 2002/0009544 | A1 | 1/2002 | McFeely et al. |
| 2002/0009896 | A1 | 1/2002 | Sandhu et al. |
| 2002/0017242 | A1 | 2/2002 | Hamaguchi et al. |
| 2002/0066411 | A1 | 6/2002 | Chiang et al. |
| 2002/0086106 | A1 | 7/2002 | Park et al. |
| 2002/0092471 | A1 | 7/2002 | Kang et al. |
| 2002/0108570 | A1 | 8/2002 | Lindfors et al. |
| 2002/0110991 | A1 | 8/2002 | Li |
| 2002/0115886 | A1 | 8/2002 | Yasuhara et al. |
| 2002/0121241 | A1 | 9/2002 | Nguyen et al. |
| 2002/0121342 | A1 | 9/2002 | Lu et al. |
| 2002/0127745 | A1 | 9/2002 | Lu et al. |
| 2002/0134307 | A1 | 9/2002 | Choi |
| 2002/0197883 | A1 | 12/2002 | Niimi et al. |
| 2003/0004723 | A1 | 1/2003 | Chihara |
| 2003/0010451 | A1 | 1/2003 | Tzu et al. |
| 2003/0017697 | A1 | 1/2003 | Choi et al. |
| 2003/0022338 | A1 | 1/2003 | Ruben et al. |
| 2003/0072913 | A1 | 4/2003 | Chou et al. |
| 2003/0075273 | A1 | 4/2003 | Kilpela et al. |
| 2003/0075925 | A1 | 4/2003 | Lindfors et al. |
| 2003/0101938 | A1 | 6/2003 | Ronsse et al. |
| 2003/0121469 | A1 | 7/2003 | Lindfors et al. |
| 2003/0140654 | A1 | 7/2003 | Kifpl |
| 2003/0143747 | A1 | 7/2003 | Bondestam et al. |
| 2003/0148628 | A1* | 8/2003 | Tay et al. ............... 438/769 |
| 2003/0194493 | A1 | 10/2003 | Chang et al. |
| 2003/0207033 | A1* | 11/2003 | Yim et al. ............ 427/255.37 |
| 2003/0221780 | A1 | 12/2003 | Lei et al. |
| 2003/0224107 | A1 | 12/2003 | Lindfors et al. |
| 2004/0011404 | A1 | 1/2004 | Ku et al. |
| 2004/0013577 | A1 | 1/2004 | Ganguli et al. |
| 2004/0016404 | A1 | 1/2004 | Gregg et al. |
| 2004/0018674 | A1* | 1/2004 | Ang et al. ............... 438/199 |
| 2004/0025370 | A1 | 2/2004 | Guenther et al. |
| 2004/0065255 | A1 | 4/2004 | Yang et al. |
| 2004/0071897 | A1 | 4/2004 | Verplancken et al. |
| 2004/0089227 | A1 | 4/2004 | Ku et al. |
| 2004/0144308 | A1 | 7/2004 | Yudovsky |
| 2004/0144311 | A1 | 7/2004 | Chen et al. |
| 2004/0203254 | A1 | 10/2004 | Conley, Jr. et al. |
| 2004/0219784 | A1 | 11/2004 | Kang et al. |
| 2004/0224506 | A1 | 11/2004 | Choi et al. |
| 2005/0045967 | A1* | 3/2005 | Sasaki et al. ............... 257/406 |
| 2005/0064207 | A1 | 3/2005 | Senzaki et al. |
| 2005/0069240 | A1 | 3/2005 | Choi et al. |
| 2005/0070126 | A1 | 3/2005 | Senzaki |
| 2005/0095859 | A1 | 5/2005 | Chen et al. |
| 2005/0104142 | A1 | 5/2005 | Narayanan et al. |
| 2005/0118807 | A1* | 6/2005 | Kim et al. ............... 438/686 |
| 2005/0130448 | A1 | 6/2005 | Olsen et al. |
| 2005/0153571 | A1 | 7/2005 | Senzaki |
| 2005/0186765 | A1* | 8/2005 | Ma et al. ............... 438/532 |
| 2005/0233156 | A1 | 10/2005 | Senzaki et al. |
| 2005/0255243 | A1 | 11/2005 | Senzaki |
| 2006/0079077 | A1* | 4/2006 | Takahashi ............... 438/591 |
| 2006/0153995 | A1 | 7/2006 | Narwankar et al. |
| 2008/0014759 | A1* | 1/2008 | Chua et al. ............... 438/763 |

OTHER PUBLICATIONS

PCT Search Report, International Application No. PCT/US2007/073525, dated Feb. 12, 2009.

* cited by examiner

METHOD FOR FABRICATING AN INTEGRATED GATE DIELECTRIC LAYER FOR FIELD EFFECT TRANSISTORS

BACKGROUND OF THE INVENTION

1. Field of the Invention

Embodiments of the invention generally relate to methods for depositing materials on substrates, and more specifically, to methods for depositing dielectric materials utilized for fabricating a gate structure on substrates.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. A CMOS transistor comprises a gate structure disposed between source and drain regions that are formed in the substrate. The gate structure generally comprises a gate electrode and a gate dielectric layer. The gate electrode is disposed over the gate dielectric layer to control a flow of charge carriers in a channel region formed between the drain and source regions beneath the gate dielectric layer.

The gate dielectric layer has a thickness selected about 30 angstroms to 40 angstroms (Å), or less to achieve the desired speed of the transistor. However, conventional thermal silicon oxide ($SiO_2$) dielectrics with thicknesses below 30 Å often have undesirable quality and decreased durability. For example, it is difficult to control the uniformity of $SiO_2$ dielectric layers having a thickness less than 30 Å. Additionally, conventional deposited $SiO_2$ dielectric layers generally have an undesirable amount of gate leakage current, i.e., tunneling current, which results in an increased amount of power consumed by the gate dielectric layer.

High-k dielectric materials (e.g., materials having a dielectric constant greater than 4) deposited by atomic layer deposition (ALD) have been widely applied in the gate structure application to obtain a low equivalent oxide thickness (EOT), and reduced gate leakage. Examples of high-k dielectric materials include silicon nitride, hafnium oxide, hafnium silicate, zirconium oxide and tantalum oxide and the like. During an ALD process, reactant gases are sequentially introduced into a process chamber containing a substrate. Generally, a first reactant is pulsed into the process chamber and is adsorbed onto the substrate surface. A second reactant is pulsed into the process chamber and reacts with the first reactant to form a substantially mono-atomic layer of deposited material. A purge step is typically carried out between the delivery of each reactant gas.

Typically, the surface topography of a substrate utilized for an ALD deposition process may determine the adsorbability of reactant gases provided by the ALD process. Poor adsorbability of reactant gases on the substrate surface may result in poor adhesion of the interfacial layer and subsequently deposited film. As gate structures become smaller and/or thinner to increase device speed, the quality and uniformity of the interfacial layer become increasingly important. Poor interfacial quality and non-uniformity of the deposited film will adversely impact the integration of the gate structure, resulting in high current leakage and low charge carrier mobility in the gate structures, which ultimately results in poor device performance.

Therefore, there is a need for an improved method for fabricating gate dielectric layers suitable for use in gate structures for field effect transistors.

SUMMARY OF THE INVENTION

Methods for fabricating an integrated gate dielectric layer on a substrate are provided. In one embodiment, a method for fabricating an integrated gate dielectric layer includes forming a silicon oxide layer on a substrate, plasma treating the silicon oxide layer, depositing a silicon nitride layer on the silicon oxide layer by an ALD process, and thermal annealing the substrate.

In another embodiment, a method for fabricating an integrated gate dielectric layer includes precleaning a substrate, forming a silicon oxide layer on the substrate, plasma treating the silicon oxide layer, depositing a silicon nitride layer on the silicon oxide layer by an ALD process, thermally annealing the substrate, forming a gate electrode on the gate dielectric layer, and forming a gate structure on the substrate.

In yet another embodiment, the method includes precleaning a substrate, forming a silicon oxide layer on the substrate, plasma treating the silicon oxide layer, depositing a silicon nitride layer on the silicon oxide layer by an ALD process, and thermal annealing the substrate, wherein the formed silicon oxide layer and the silicon nitride layer has a total thickness less than 30 Å.

BRIEF DESCRIPTION OF THE DRAWINGS

The teachings of the present invention can be readily understood by considering the following detailed description in conjunction with the accompanying drawings, in which:

FIGS. 3A-F illustrate a substrate during various stages of the process sequence referred to in FIG. 2.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally provide methods for fabricating integrated gate dielectric materials suitable for use as a gate dielectric layer of a field effect transistor. In one embodiment, the method for fabricating an integrated gate dielectric layer includes using an ALD process to deposit a silicon nitride layer over a plasma-treated silicon oxide layer. The plasma-treated silicon oxide layer provides nucleation sites that promote adherence of atomics provided by reactants in the ALD process, thereby improving the uniformity and interfacial adhesion of the subsequently deposited silicon nitride layer with improved uniformity and interfacial adhesion. The integrated gate dielectric layer has a total thickness less than about 30 Å while maintaining low equivalent oxide thickness (EOT), low leakage current and high charge carrier mobility in the channel regions of the transistor.

Figure 1:
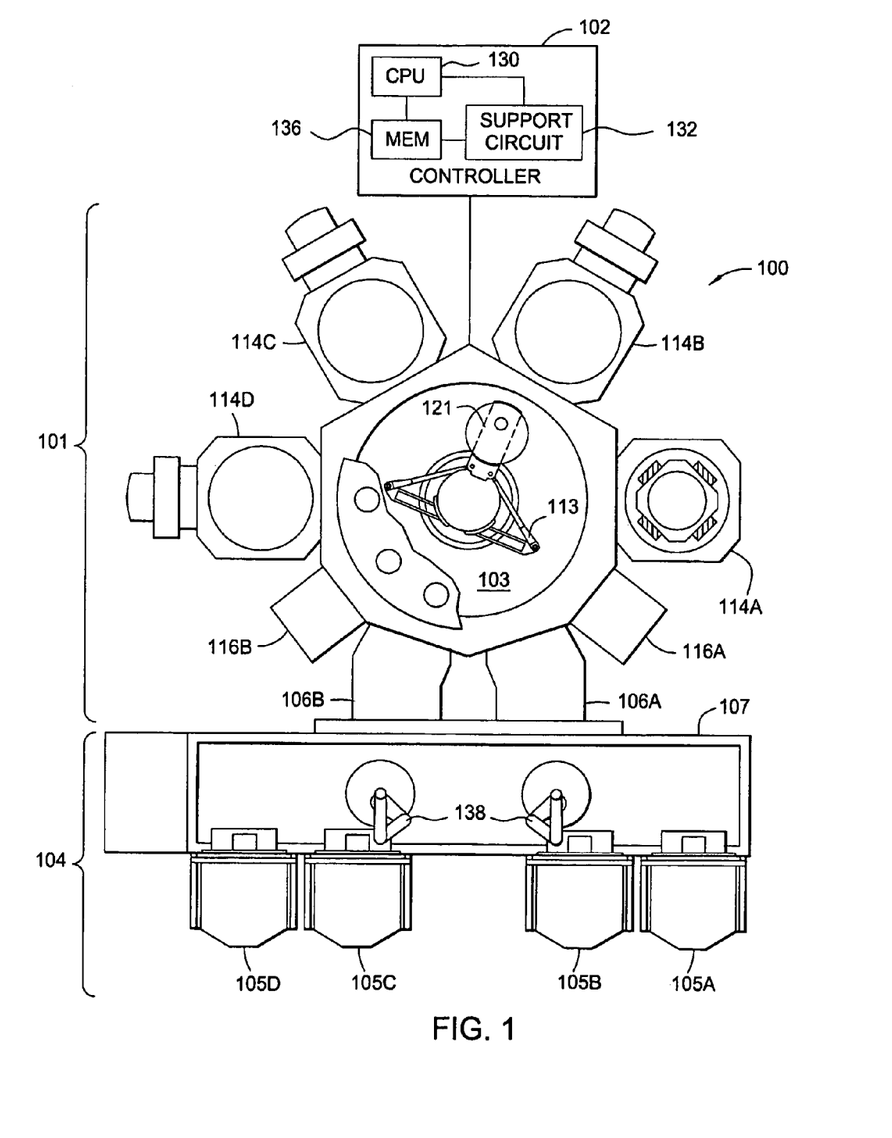
FIG. 1 illustrates a schematic diagram of an exemplary integrated semiconductor substrate processing system (e.g., a cluster tool) which may be used to practice at least one embodiment of the invention.

FIG. 1 is a schematic view of an integrated tool 100 for processing semiconductor substrates in which embodiments of the present invention may be practice. Examples of suitable integrated tools include the CENTURA® and ENDURA® integrated tools, all available from Applied Materials, Inc. of Santa Clara, Calif. It is contemplated that the methods described herein may be practiced in other tools having the requisite process chambers coupled thereto, including those from other manufacturers.

The tool 100 includes a vacuum-tight processing platform 101, a factory interface 104, and a system controller 102. The platform 101 has a plurality of processing chambers 114A-D and load-lock chambers 106A-B that are coupled to a vacuum substrate transfer chamber 103. The factory interface 104 is coupled to the transfer chamber 103 by the load lock chambers 106A-B.

In one embodiment, the factory interface 104 includes at least one docking station 107 and at least one factory interface robot 138. The docking station 107 is configured to accept one or more front opening unified pod (FOUP). Four FOUPS 105A-D are shown in the embodiment of FIG. 1. The factory interface robot 138 is configured to transfer substrates in the factory interface 104 between the FOUPs 105A-D and the loadlock chambers 106A-B.

The loadlock chambers 106A-B have a first port coupled to the factory interface 104 and a second port coupled to the transfer chamber 103. The loadlock chamber 106A-B are coupled to a pressure control system (not shown) which pumps down and vents the chambers 106A-B to facilitate passing the substrate between the vacuum environment of the transfer chamber 103 and the substantially ambient (e.g., atmospheric) environment of the factory interface 104.

The transfer chamber 103 has a vacuum robot 113 disposed therein. The vacuum robot 113 is capable of transferring substrates 121 between the loadlock chamber 106A-B and the processing chambers 114A-D.

In one embodiment, the processing chambers coupled to the transfer chamber 103 may be a chemical vapor deposition (CVD) chamber 114D, a Decoupled Plasma Nitridation (DPN) chamber 114C, a Rapid Thermal Process (RTP) chamber 114B, or an atomic layer deposition (ALD) chamber 114A. Alternatively, different processing chambers, including at least one of ALD, CVD, Metal Organic Chemical Vapor Deposition (MOCVD), Physical Vapor Deposition (PVD), DPN or RTP chambers may be interchangeably incorporate into the integrated tool 100 in accordance with process requirements. Suitable ALD, CVD, PVD, DPN, RTP, and MOCVD processing chambers are available from Applied Materials, Inc., among others.

In one embodiment, an optional service chamber (shown as 116A-B) may be coupled to the transfer chamber 103. The service chambers 116A-B may be configured to perform other substrate processes, such as degassing, orientation or cool down, among others.

The system controller 102 is coupled to the integrated processing tool 100. The system controller 102 controls the operation of the tool 100 by direct control of the process chambers 114A-D of the tool 100, or alternatively, by controlling the computers (or controllers) associated with the process chambers 114A-D and the tool 100. In operation, the system controller 102 enables data collection and feedback from the respective chambers and system to optimize performance of the tool 100.

The system controller 102 generally includes a central processing unit (CPU) 130, memory 134, and support circuit 132. The CPU 130 may be one of any form of a general purpose computer processor that can be used in an industrial setting. The support circuits 132 are conventionally coupled to the CPU 130 and may comprise cache, clock circuits, input/output subsystems, power supplies, and the like. The software routines when executed by the CPU 130, transform the CPU into a specific purpose computer (controller) and enable processes, such as a gate dielectric layer deposition process 200 described below with reference to FIG. 2, to be performed in the tool 100. The software routines may also be stored and/or executed by a second controller (not shown) that is located remotely from the tool 100.

Figure 2:
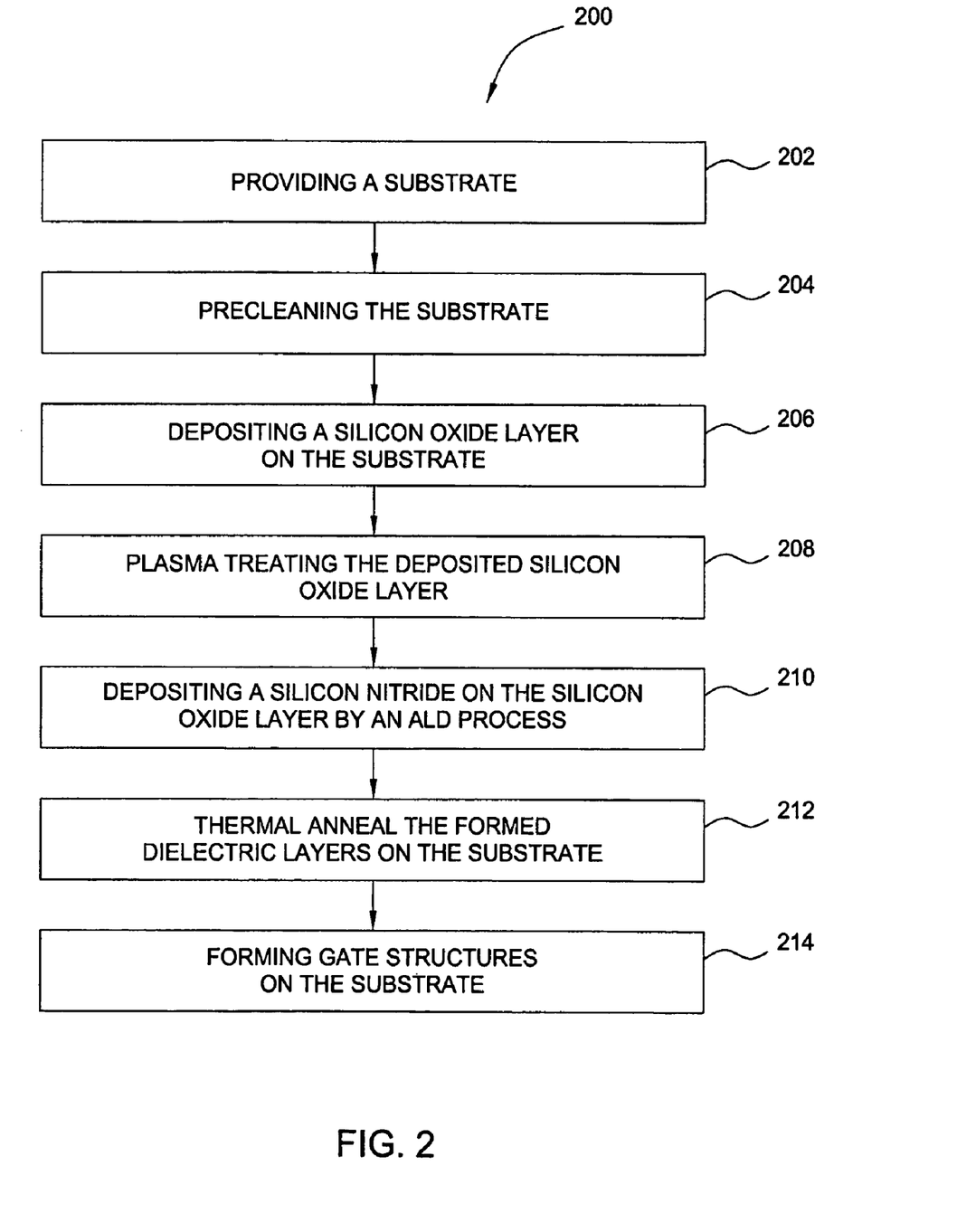
FIG. 2 illustrates a flow chart of an exemplary process for depositing dielectric layers on the substrate in the cluster tool in FIG. 1.

FIG. 2 illustrates a process flow chart of one embodiment of a method 200 for depositing gate dielectric layers on a substrate in a process tool, such as the tool 100 described above. FIGS. 3A-3F are schematic, cross-sectional views corresponding to different stages of the process 200. It is contemplated that the method 200 may be performed on other suitably configured tools.

The method 200 begins at step 202 by providing a substrate 121 on which the gate dielectric layer will be formed. The substrate 121, as shown in FIG. 3A, may be any substrate or material surface upon which film processing is performed. For example, the substrate 121 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 121 may have various dimensions, such as 200 mm or 300 mm diameter wafers, as well as, rectangular or square panes. Unless otherwise noted, embodiments and examples described herein are conducted on substrates with a 200 mm diameter or a 300 mm diameter.

At an optional step 204, a precleaning process may be performed on the surface of the substrate 121. The precleaning step may be performed in one of the process chambers 114A-D of the tool 100. The precleaning step. 204 is configured to cause compounds exposed on the surface of the substrate 121 to terminate in a functional group. Functional groups attached and/or formed on the surface of the substrate 121 include hydroxyls (OH), alkoxy (OR, where R=Me, Et, Pr or Bu), haloxyls (OX, where X=F, Cl, Br or I), halides (F, Cl, Br or I), oxygen radicals and aminos (NR or $NR_2$, where R=H, Me, Et, Pr or Bu). The precleaning process may expose the surface of the substrate 121 to a reagent, such as $NH_3$, $B_2H_6$, $SiH_4$, $SiH_6$, $H_2O$, HF, HCl, $O_2$, $O_3$, $H_2O$, $H_2O_2$, $H_2$, atomic-H, atomic-N, atomic-O, alcohols, amines, plasmas thereof, derivatives thereof or combination thereof. The functional groups may provide a base for an incoming chemical precursor to attach on the surface of the substrate 121. In one embodiment, the precleaning process may expose the surface of the substrate 121 to a reagent for a period from about 1 second to about 2 minutes. In another embodiment, the exposure period may be from about 5 seconds to about 60 seconds. Precleaning processes may also include exposing the surface of the substrate 121 to an RCA solution (SC1/SC2), an HF-last solution, peroxide solutions, acidic solutions, basic solutions, plasmas thereof, derivatives thereof or combinations thereof. Useful precleaning processes are described in commonly assigned U.S. Pat. No. 6,858,547 and co-pending U.S. patent application Ser. No. 10/302,752, filed Nov. 21, 2002, entitled, "Surface Pre-Treatment for Enhancement of Nucleation of High Dielectric Constant Materials,"

and published as US 20030232501, which are both incorporated herein by reference in their entirety.

In an exemplary embodiment of a precleaning process, a native oxide layer 302, as shown in FIG. 3A, may be removed by a HF-last solution. The wet-clean process may be performed in a TEMPEST™ wet-clean system, available from Applied Materials, Inc. In another example, the substrate 121 is exposed to water vapor derived from a Water Vapor Generating (WVG) system for about 15 seconds.

Figure 3B:
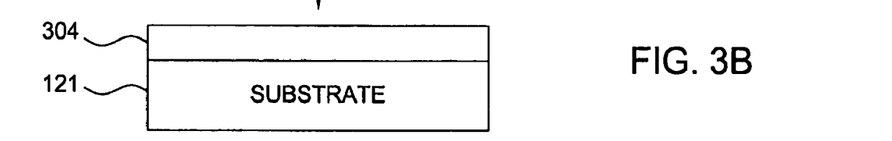

At step 206, a silicon oxide layer 304 is formed on the substrate 121 in a process chamber, as shown in FIG. 3B. The process chamber may be one of the process chambers 114A-D configured as an RTP chamber. Examples of process chamber used to form silicon oxide layer 304 include Radiance® system available from Applied Materials, Inc. The silicon oxide layer 304 may be deposited a chemical vapor deposition (CVD), rapid thermal-CVD (RT-CVD), plasma enhanced-CVD (PE-CVD), physical vapor deposition (PVD), atomic layer deposition (ALD), atomic layer epitaxy (ALE) or combinations thereof.

In one embodiment, the silicon oxide layer 304 is a thermal oxide layer formed by an RTP process performed at a temperature between about 650 degrees Celsius to about 980 degrees Celsius, such as between about 750 degrees Celsius and about 950 degrees Celsius. The silicon oxide layer 304 is deposited to a thickness less than about 30 Å, such as less than about 20 Å, for example, about 15 Å or less. A process gas mixture including oxygen gas ($O_2$) is supplied into the chamber between about 0.5 standard liters per minute (slm) to about 10 slm, such as about 2 slm. The process pressure may be regulated between about 0.5 Torr and about 50 Torr, such as 2 Torr. The deposition process may be performed between about 5 seconds to about 30 seconds.

Figure 3C:
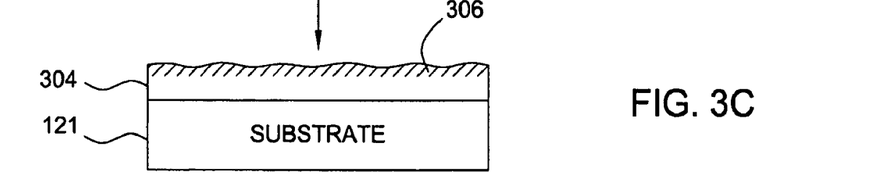

At step 208, a light plasma treatment step is performed on the silicon oxide layer 304. The light plasma treatment step is performed to treat the substrate surface of the silicon oxide layer 304, thereby forming plasma-treated layer 306, as depicted in FIG. 3C. In one embodiment, the treatment step 208 is performed in one of the chambers 114A-D.

Figure 4A:
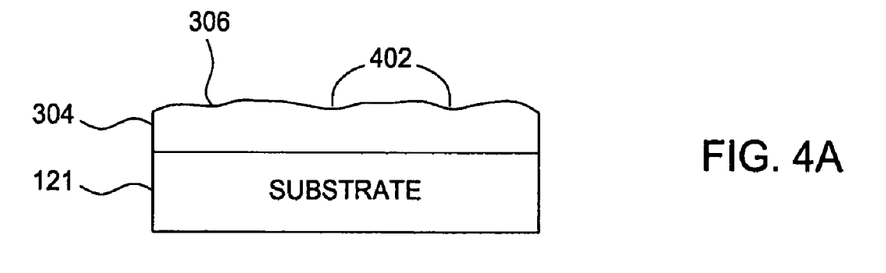
FIGS. 4A-D illustrate enlarged views of respective portions of FIG. 3B-F.

FIG. 4A shows an enlarged view of the surface of the plasma-treated surface 306 depicted in FIG. 3C. The plasma-treated surface 306 has a plurality of shallow nucleation sites 402 that promotes absorption and adherence of subsequent deposited atoms from an ALD process resulting in between interface adhesion and control of the deposited dielectric layer to the plasma-treated surface 306. Nucleation sites formed on the plasma-treated surface 306 provide entropy gain and locations for better heat exchange favorable for a reaction. The light plasma treatment step 208 is a gentle treatment process that creates shallow nucleation sites on the silicon oxide surface without adversely damage and penetrating the underlying layer which would cause device performance failure and current leakage.

The light plasma treatment at step 208 may include a decoupled inert gas plasma process performed by flowing an inert gas into a decoupled plasma nitridation (DPN) chamber or a remote inert gas plasma process by flowing an inert gas into a process chamber equipped by a remote plasma system. The silicon oxide layer 304 is slightly treated with ionic gas species formed by a process gas flowing into the DPN chamber. Gases that may be used in the plasma process include nitrogen containing gas, such as $N_2$ or $NH_3$, argon (Ar), helium (He), neon, xenon or combinations thereof. The process gas flowed into the DPN chamber treats the silicon oxide layer 304, thereby slightly modifying the surface property of the silicon oxide layer 304 and forming the treated surface 306 on the upper surface of the silicon oxide layer 304.

In one embodiment, the plasma treatment step 208 has a duration of about 10 seconds to about 300 seconds, for example, from about 30 seconds to about 240 seconds, and in one embodiment, from about 60 seconds to about 180 seconds. Also, the plasma process is conducted at a plasma power, such as an inductive RF power at 13.56 MHz, setting from about 500 Watts to about 3,000 Watts, for example, from about 700 Watts to about 2,500 Watts, for example, from about 800 Watts to about 1400 Watts. Generally, the plasma process is conducted with a duty cycle of about 2 percent to about 50 percent, or at 100 percent duty as continuous cycles and at a pulse frequency at about 10 kHz. In one embodiment, the RF power is pulsed at a duty cycle of about 5 percent. In another embodiment, the RF power is pulsed at about 5 percent duty cycle at a set point of about 800 Watts, resulting in an effective power of about 40 Watts effective plasma excitation power. Alternatively, the plasma power may be provided by other plasma source, including planar microwave plasma sources, or other suitable sources utilized for practice the present invention. The DPN chamber may have a pressure from about 10 mTorr to about 80 mTorr. The inert gas may have a flow rate from about 10 standard cubic centimeters per minute (sccm) to about 5 standard liters per minute (slm), or from about 50 sccm to about 750 sccm, or from about 200 sccm to about 500 sccm. When the silicon oxide layer 304 is treated by a nitrogen containing layer as an inert gas, the plasma-treated silicon oxide layer 306 has a nitrogen concentration between about $0.2E^{15}$ atoms/$cm^2$ to about $1E^{15}$ atoms/$cm^2$.

Figure 3D:
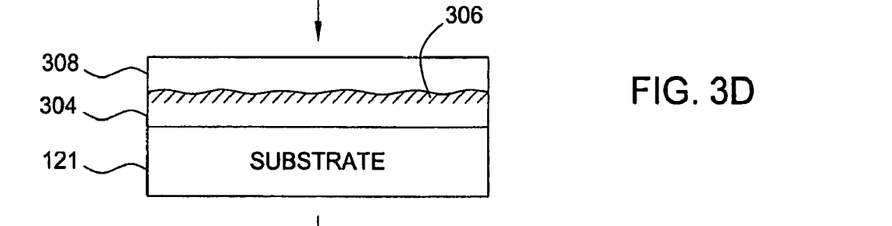

At step 210, a silicon nitride layer 308 is deposited on the silicon oxide layer 304 by an ALD process, as shown in FIG. 3D. The silicon nitride layer may be deposited in an ALD process chamber that is one of the process chambers 114A-D. As the treated surface 306 of the silicon oxide layer 304 has nucleate sites 402 formed thereon, the atoms from the reactants supplied by the ALD process at step 210 are readily absorbed and embedded on the nucleation sites 402.

Figure 4B:
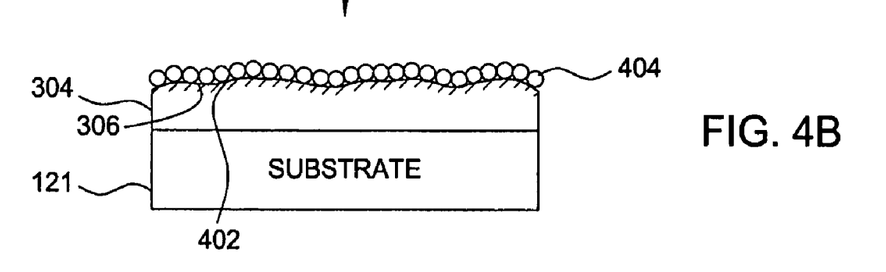
Figure 4C:
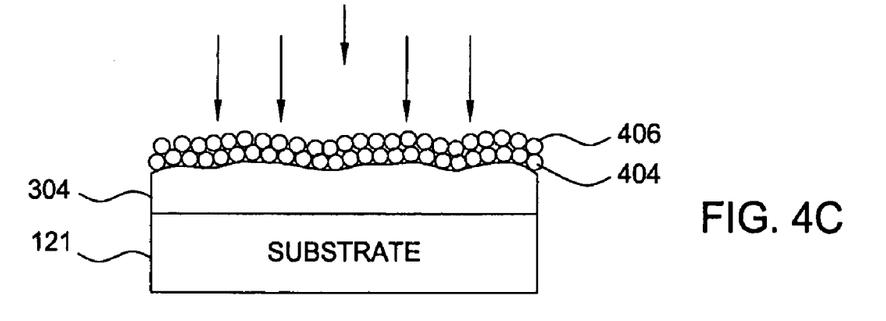
Figure 4D:
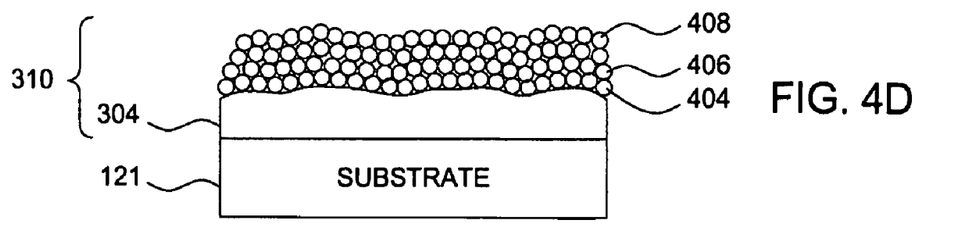

FIGS. 4B-4D further shows magnified views of the silicon nitride layer 308 deposited by the ALD process absorbed on the surface of the plasma-treated surface 306 in FIG. 3D. The atoms of a first reactant of the ALD process are absorbed on the nucleate sites 402 of the plasma-treated surface 306 forming a uniform first atomic layer 404 on the plasma-treated surface 306, as shown in FIG. 4B. As atoms of a second reactant pulsed into the process chamber and reacted with the atoms of first reactant, the atoms of the second reactant are closely packed and piled on the atomic layer 404, forming a second atomic layer 406 on the first atomic layer 404, as shown in FIG. 4C. As the cycles of the pulses and purges accumulates, a closely packed atomic lattice of the silicon nitride layer 308 is deposited on the plasma-treated surface 306, as shown in FIG. 4D. A thermal anneal process is subsequently performed to reconstruct the deposited films and allow the deposited films to self-grain and rearrange into a more closed compact state.

As compared to a conventional substrate surface that has not been exposed to a light plasma treatment process, the atoms of the ALD process tends to randomly fall and be absorbed on the substrate surface. As conventionally flat surfaces may not be able to provide sufficient nucleation sites that allow the atoms of the reactant to readily absorb thereon, poor adhesion, non-uniformity, and loose atomic structures of the interfacial layer are created upon depositing the subsequent atomic or other layers. By utilizing the light plasma treatment process at step 208, the subsequently deposited film will be efficiently absorbed on the nucleate sites on the treated surface, thereby resulting in a uniform and smooth, well-adhered deposited layer.

In one embodiment, the silicon nitride layer 308 is deposited by an ALD process to a thickness of less than about 20 Å, such as less than about 15 Å, for example, about 10 Å or less. The integrated silicon nitride layer and the silicon oxide layer form a gate dielectric layer suitable for use in a gate structure with a low equivalent oxide thickness (EOT) unit, reduced gate leakage and increased the stability and density of the deposited dielectric materials.

In one embodiment, the ALD process for depositing silicon nitride layer 308 is performed at a chamber pressure from about 1 Torr to about 100 Torr, or from about 1 Torr to about 20 Torr, or from about 1 Torr to about 10 Torr. The temperature of the substrate 121 may be maintained from about 70 degrees Celsius to about 700 degrees Celsius, or from about 100 degrees Celsius to about 650 degrees Celsius, or from about 400 degrees Celsius to about 600 degrees Celsius. A silicon containing gas, such as silane based gas, may be a first reactant introduced into the process chamber at a rate between about 5 sccm and about 500 sccm, such as between about 50 sccm and about 250 sccm. Examples of silane based gases include $SiH_4$, $Si_2H_6$, dichlorosilane (DCS), tetrachlorosilane (TCS), hexachlorodisilane (HCD), and the like. The silicon containing gas may be introduced with a carrier gas, such as nitrogen, argon, helium, or the like, with a total flow rate between about 50 sccm and about 5000 sccm, such as between 500 sccm and about 2000 sccm. The silicon containing gas may be pulsed into the process chamber at a rate between about 0.1 second per pulse and about 90 seconds per pulse, such as between about 1 second per pulse and about 60 seconds per pulses, for example, between about 5 seconds per pulse and about 30 seconds per pulse. After the substrate is exposed to the first reactant, a second reactant is introduced. In between the supply of the first reactant and the second reactant, a purge gas may be used to purge and flush out the residual gas remaining in the process chamber. Examples of purge gas may include He, Ar, and $N_2$, among others.

A nitrogen containing gas may be the second reactant and be introduced into the process chamber at a flow rate between about 100 sccm to about 10000 sccm, for example, between about 1000 sccm and about 5000 sccm. Suitable nitrogen containing gases include, but not limited to, $NH_3$, $N_2$, $N_2O$, $N_2H_4$, and the like. The nitrogen containing gas may be pulsed into the process chamber at a rate of about 0.5 second per pulse to about 300 second per pulse, for example, from about 10 seconds per pulse to about 200 seconds per pulse, such as from about 30 to about 120 seconds per pulse. The numbers of exposed cycles to the first and second reactions may be selected to reach a desired film thickness of deposited material. In between the supply of the first reactant gas and the second reactant gas, a purge gas may be used to purge and flush out the residual gas remaining in the process chamber. Examples of purge gases may include He, Ar, and $N_2$, among others.

At step 212, the silicon oxide layer 304 and the silicon nitride layer 308 disposed on the substrate 121 are exposed to a thermal annealing process. Step 212 may be performed in one of the process chambers 114A-D. An example of a suitable RTP chamber in which step 212 may be performed is the CENTURA™ RADIANCE™ RTP chamber, available from Applied Materials, Inc.

In one embodiment, the substrate 121 may be thermally heated during step 212 to a temperature between about 600 degrees Celsius and about 1,200 degrees Celsius. In another embodiment, the temperature may be controlled between about 700 degrees Celsius to about 1,150 degrees Celsius, such as between about 800 degrees Celsius and about 1,000 degrees Celsius. The thermal annealing process may have different durations. In one embodiment, the duration of the thermal annealing process may be from about 1 second to about 180 seconds, for example, about 2 seconds to about 60 seconds, such as about 5 seconds to about 30 seconds.

At least one annealing gas is supplied into the chamber for thermal annealing process. Examples of annealing gases include oxygen ($O_2$), ozone ($O_3$), atomic oxygen (O), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), hydrazine ($N_2H_4$), derivatives thereof or combinations thereof. The annealing gas may contain nitrogen and at least one oxygen-containing gas, such as oxygen. The chamber may have a pressure from about 0.1 Torr to about 100 Torr, for example, about 0.1 to about 50 Torr, such as 0.5 Torr. In one example of a thermal annealing process, substrate 121 is heated to a temperature of about 1,000 degrees Celsius for about 15 seconds within an oxygen atmosphere. In another example, substrate 121 is heated to a temperature of about 1,100 degrees Celsius for about 10 seconds to about 25 seconds within an atmosphere containing equivalent volumetric amounts of nitrogen and oxygen during the annealing process.

Figure 3E:
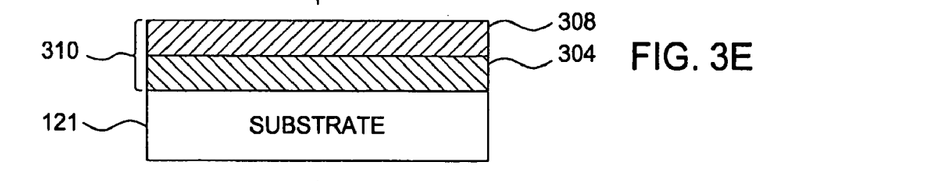

The thermal annealing process converts the silicon oxide layer 304 and the silicon nitride layer 308 to a post anneal layer 310, as depicted in FIG. 3E. As discussed above, the thermal annealing process repairs and reconstructs the atomic lattices of the deposited films and reduces the fixed charge of post anneal layer 310. The thermal annealing process also drives out the dangling bond of the hydrogen content and reconstruct the film bonding structure, thereby reducing film leakage and promoting the film qualities and overall device performance. The post anneal layer 312 smoothes the surface topography of the upper surface of the integrated gate dielectric layer and results in a surface roughness less than about 0.1 nm. In one embodiment, the post anneal layer 312 may have a combined film thickness of the integrated gate dielectric layer between about 10 Å to about 30 Å. In another embodiment, the combine thickness may be from about 12 Å to about 28 Å. In yet another embodiment, the thickness may be from about 15 521 to about 25 Å, such as 20 Å.

Figure 3F:
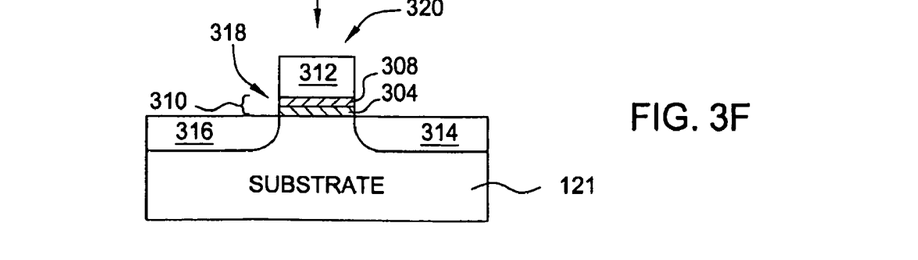

At step 214, a gate structure 320 may be formed on the substrate 121, as shown in FIG. 3F. After the post anneal layer 310 is formed on the substrate as a gate dielectric layer 318, a gate electrode layer is deposited and etched to form a gate electrode 312 while the gate dielectric layer 310 is etched to form a gate dielectric 318. The gate electrode and dielectric 312,318 form the gate structure 320 on the substrate 121. Source 316 and drain regions 314 may be created in the substrate 121 proximate the gate dielectric 318 by an ion implantation process proximate the gate structure 320 to complete the transistor. Several process steps, including lithography and etch process carried out to form the gate structure 320 on the substrate, have been omitted for the sake of brevity. It is contemplated that the gate dielectric 318, formed by the silicon oxide layer 304 and silicon nitride layer 308 as descried in the present invention, may be utilized as a portion of a gate structure (e.g., a composite of oxide and nitrogen layer, at least one or more oxide layers sandwiching a nitrogen layer) practiced in different device applications, such as flash devices.

Thus, methods for fabricating an integrated gate dielectric layer utilized in a gate fabrication for field effect transistors are provided. The improved light plasma treatment process enhances the nucleation of the subsequently deposited film by an ALD process, thereby providing a smooth and uniform deposited film having good adhesion while maintaining a low equivalent oxide thickness (EOT) making the integrated gate dielectric advantageously suitable for gate fabrication.

While the foregoing is directed to embodiments of the invention, other and further embodiments of the invention may be devised without departing from the basic scope thereof, and the scope thereof is determined by the claims that follow.

What is claimed is:

1. A method for forming dielectric layers on a substrate, comprising:
   forming a silicon oxide layer on a substrate;
   plasma treating nitrogen atoms into the silicon oxide layer using RF power applied at a duty cycle selected to provide a nitrogen concentration in the silicon oxide layer of between about $0.2E^{15}$ atoms/cm$^2$ to about $1E^{15}$ atoms/cm$^2$, wherein plasma treating the silicon oxide layer further comprises creating nucleation sites on the silicon oxide layer;
   depositing a silicon nitride layer on the silicon oxide layer by an ALD process; and
   thermal annealing the substrate.

2. The method of claim 1, wherein the step of plasma treating the silicon oxide layer further comprises:
   flowing an inert gas into a plasma treatment chamber; and
   forming a plasma by the inert gas, wherein the inert gas is a nitrogen containing gas.

3. The method of claim 2, wherein the step of flowing the inert gas further comprises:
   flowing the inert gas between about 50 sccm and about 750 sccm into the plasma treatment chamber.

4. The method of claim 2, wherein the step of forming a plasma further comprises:
   applying a RF power between about 500 Watts and about 3000 Watts.

5. The method of claim 2, wherein the inert gas is mixed with a gas selected from a group consisting of Ar, He, Ne, Xe, and the combination thereof.

6. The method of claim 1, further comprising:
   precleaning the substrate prior to forming the silicon oxide layer.

7. The method of claim 1, wherein the step of forming the silicon oxide layer, further comprises:
   forming the silicon oxide layer with a thickness less than 15 Å.

8. The method of claim 1, wherein depositing the silicon nitride layer further comprises:
   depositing the silicon nitride with a thickness less than 15 Å.

9. The method of claim 1, wherein the step of depositing the silicon nitride layer further comprises:
   cyclically flowing a silicon containing gas and a nitrogen containing gas into an ALD chamber.

10. The method of claim 9, wherein the step of flowing further comprises:
    flowing the silicon containing gas into the ALD chamber between about 5 sccm and about 500 sccm; and then
    flowing the nitrogen containing gas into the ALD chamber between about 1000 sccm and about 5000 sccm.

11. The method of claim 9, wherein the nitrogen containing gas is at least one of $NH_3$, $N_2$, $N_2H_4$ or $N_2O$.

12. The method of claim 9, wherein the silicon containing gas is at least one of $SiH_4$, $Si_2H_6$, dichlorosilane (DCS), tetrachlorosilane (TCS) or hexachlorodisilane (HCD).

13. The method of claim 1, wherein the silicon oxide layer and the silicon nitride layer form a gate dielectric layer.

14. A method for forming a gate dielectric layer on a substrate, comprising:
    precleaning a substrate;
    forming a silicon oxide layer on the substrate;
    supplying a RF power between about 800 Watts and about 1400 Watts to form a plasma from a nitrogen containing gas, wherein the RF power is applied at a duty cycle selected to provide a nitrogen concentration in the silicon oxide layer of between about $0.2E^{15}$ atoms/cm$^2$ to about $1E^{15}$ atoms/cm$^2$, wherein the duty cycle includes at least one of pulsing the RF power or supplying power at a duty cycle of about 2 percent and about 50 percent;
    plasma treating the silicon oxide layer in the presence of the plasma formed from the nitrogen containing gas to obtain a nitrogen concentration in the silicon oxide layer between about $0.2E^{15}$ atoms/cm$^2$ to about $1E^{15}$ atoms/cm$^2$, wherein plasma treating the silicon oxide layer further comprises creating nucleation sites on the silicon oxide layer;
    depositing a silicon nitride layer on the silicon oxide layer by an ALD process; and
    thermal annealing the substrate, wherein the silicon oxide layer and the silicon nitride layer form a gate dielectric layer.

15. The method of claim 14, wherein the silicon oxide layer and the silicon nitride layer have a total thickness less than 30 Å.

16. A method for forming a gate structure, comprising:
    precleaning a substrate;
    forming a silicon oxide layer on the substrate;
    plasma treating nitrogen atoms into the silicon oxide layer using RF power applied at a duty cycle selected to provide a nitrogen concentration in the silicon oxide layer of between about $0.2E^{15}$ atoms/cm$^2$ to about $1E^{15}$ atoms/cm$^2$, wherein plasma treating the silicon oxide layer further comprises creating nucleation sites on the silicon oxide layer;
    depositing a silicon nitride layer on the silicon oxide layer by an ALD process;
    thermal annealing the substrate, wherein the silicon oxide layer and the silicon nitride layer has a total thickness less than 30 Å and forms a gate dielectric;
    forming a gate electrode on the gate dielectric; and
    forming source and drain regions in the substrate proximate the gate electrode.

17. The method of claim 16, wherein plasma treating further comprises:
    applying a RF power to generate plasma, wherein the RF power is applied at a duty cycle of about 5 percent at a set point of about 800 Watts.

18. The method of claim 17, wherein the plasma treating further comprises:
    applying RF power having an effective power of about 40 Watts.

* * * * *

UNITED STATES PATENT AND TRADEMARK OFFICE
CERTIFICATE OF CORRECTION

PATENT NO.         : 7,601,648 B2  
APPLICATION NO. : 11/496411  
DATED                : October 13, 2009  
INVENTOR(S)       : Chua et al.

Page 1 of 1

It is certified that error appears in the above-identified patent and that said Letters Patent is hereby corrected as shown below:

In References Cited (56):

Please delete "2003/0140654 A1 7/2003 Kifpl" and insert --2003/0140854 A1 7/2003 Kilpi-- therefor;

Please delete "2004/0089227 A1 4/2004 Ku et al." and insert --2004/0069227 A1 4/2004 Ku et al.-- therefor;

Please delete "2005/0069240 A1 3/2005 Choi et al" and insert --2005/0059240 A1 3/2005 Choi et al-- therefor;

In the Detailed Description:

Column 8, Line 43, please delete "521" and insert --Å-- therefor.

Signed and Sealed this

Twenty-second Day of December, 2009

David J. Kappos  
*Director of the United States Patent and Trademark Office*